United States Patent [19]

Hieber et al.

[11] 4,155,766

[45] May 22, 1979

[54] HALF TONE SCREEN FOR ROTARY GRAVURE PRINTING

[76] Inventors: Helmut Hieber, Forsterstr. 7, 8000 Munich 90 (BRD), Fed. Rep. of Germany; Horst Schwarz, Burgsteinstrabe 7, 8170 Bad Tölz, Oberfischbach (BRD), Fed. Rep. of Germany

[21] Appl. No.: 753,091

[22] Filed: Dec. 21, 1976

[30] Foreign Application Priority Data

Jun. 3, 1976 [DE] Fed. Rep. of Germany ....... 2624930

[51] Int. Cl.² .............................................. G03F 5/00
[52] U.S. Cl. .................................... 96/116; 29/121.2; 96/38; 101/170
[58] Field of Search ............... 101/150, 170, 350, 363; 118/212; 29/121.1, 121.2, 121.3, 121.4, 121.5; 96/116, 38, 45, 117, 118

[56] References Cited

U.S. PATENT DOCUMENTS

| | | | |
|---|---|---|---|
| 1,307,824 | 6/1919 | Larsen | 96/116 |
| 1,990,231 | 2/1935 | Grenell | 96/116 |
| 3,928,038 | 12/1975 | Bergin | 101/170 |

FOREIGN PATENT DOCUMENTS

| | | | |
|---|---|---|---|
| 125501 | 7/1928 | Switzerland | 96/116 |
| 503945 | 7/1937 | United Kingdom | 96/45 |
| 501924 | 3/1939 | United Kingdom | 101/350 |
| 631118 | 10/1949 | United Kingdom | 96/116 |

*Primary Examiner*—Clyde I. Coughenour
*Attorney, Agent, or Firm*—Jacob L. Kollin

[57] ABSTRACT

The opaque elements of a half-tone screen for gravure printing using a rotary printing machine are connected with each other by fine connections extending in the direction of cylinder movement.

1 Claim, 2 Drawing Figures

HALF TONE SCREEN FOR ROTARY GRAVURE PRINTING

The present invention relates exclusively to the special arrangment form of the screen elements and not, however to gravure elements.

In the case of rotary gravure printing half-tone screens are employed, whose opaque screen elements comprise various geometrical shapes arranged alongside each other and separated from each other by connecting transparent portions. The geometrical shapes can be square, round, oval or the like.

As is known gravure or intaglio printing cylinders have half-tone elements in the form of depressions, so-called ink pits, which during printing accept ink and impart it to the material to be printed. The transparent connecting parts of the half-tone array have the purpose of forming firm lands after the production of the cylinder, which serve as a means for supporting and guiding the doctor.

In the case of printing on non-absorbent materials as for example aluminium, regenerated cellulose foil and plastics foils, prior art half-tone designs tend to ink unevenly since the ink tends to form small beads which means that it is unevenly taken up or repelled by the material to be printed. The unevenness is due to the ink consistency which is necessary for printing to take place.

One aim of the invention is that of ensuring even inking even in the case of printing on non-absorbent materials to be printed.

In the case of a half-tone screen for rotary gravure printing, consisting of opaque half-tone elements of any suitable structure, which are separated by transparent connecting pieces there is the proposal in accordance with the invention that the half-tone elements should be connected in a direction of run of the cylinder by fine ink conducting or ink accepting connections with each other. As a result it becomes possible to adapt the ink consistancy to the material to be printed and to transmit the ink evenly and optimally to the material to be printed.

In accordance with a further principle of the invention there is the proposal that individual half-tone elements are themselves vignetted in a half-tone manner.

In the accompanying drawings.

Figure 1:
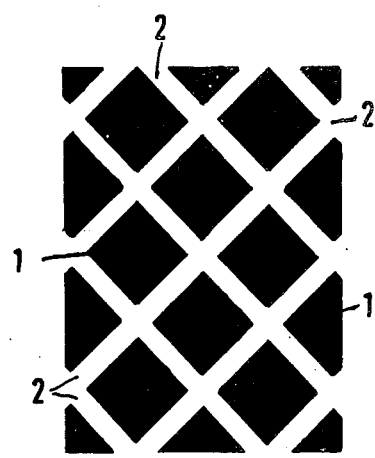
FIG. 1 shows a part of a prior art half-tone screen.

The half-tone screen in accordance with FIG. 1 comprises square opaque half-tone screen elements 1 arranged adjacent to each other. They are separated from each other by transparent connecting pieces 2.

Figure 2:
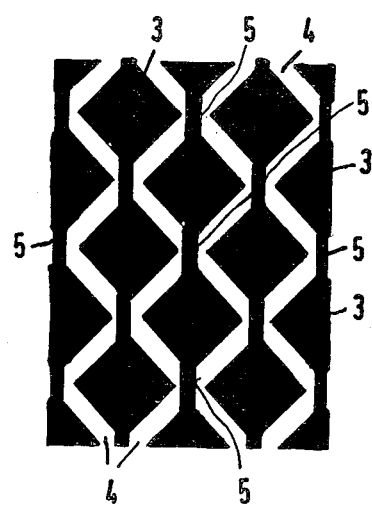
FIG. 2 shows such a screen in accordance with the invention with square half-tone screen elements on a highly magnified scale.

The half-tone screen in accordance with FIG. 2 consists of individual half-tone screen elements 3 which are separated by transparent connecting pieces 4. In this respect the half-tone screen elements are connected with each other in the direction of run of the cylinder by fine connecting pieces 5 which are also capable of carrying ink.

What we claim is:

1. A halftone screen for use in rotary gravure printing comprising a screen having opaque and transparent areas, the opaque areas being in the shape of parallel rows of squares with opposite corners of the squares in one direction connected to adjacent squares in the row by fine opaque lines and with the squares of the parallel adjacent rows in said one direction being staggered with respect to the squares of the adjacent rows with each row of squares separated by a continuous transparent area in a zigzag configuration.

* * * * *